United States Patent
Lee et al.

(10) Patent No.: US 8,895,957 B2
(45) Date of Patent: Nov. 25, 2014

(54) LIGHT EMITTING DEVICE AND METHOD OF MANUFACTURING THE SAME

(71) Applicant: Seoul Viosys Co., Ltd., Ansan-si (KR)

(72) Inventors: Jong Lam Lee, Pohang-si (KR); Jae Ho Lee, Yongin-si (KR); Yeo Jin Yoon, Ansan-si (KR); Eu Jin Hwang, Siheung-si (KR); Dae Won Kim, Seoul (KR)

(73) Assignee: Seoul Viosys Co., Ltd, Ansan-si (KR)

( * ) Notice: Subject to any disclaimer, the term of this patent is extended or adjusted under 35 U.S.C. 154(b) by 0 days.

(21) Appl. No.: 14/015,411

(22) Filed: Aug. 30, 2013

(65) Prior Publication Data
US 2013/0341592 A1 Dec. 26, 2013

Related U.S. Application Data

(63) Continuation of application No. 13/862,052, filed on Apr. 12, 2013, now Pat. No. 8,704,246, which is a continuation of application No. 11/993,965, filed as application No. PCT/KR2006/002427 on Jun. 22, 2006, now Pat. No. 8,476,648.

(30) Foreign Application Priority Data

Jun. 22, 2005 (KR) .................. 10-2005-0053797
Jun. 24, 2005 (KR) .................. 10-2005-0055179
Mar. 8, 2006 (KR) .................. 10-2006-0021801

(51) Int. Cl.
*H01L 33/24* (2010.01)
(Continued)

(52) U.S. Cl.
CPC .............. *H01L 33/24* (2013.01); *H01L 33/20* (2013.01); *H01L 33/385* (2013.01);
(Continued)

(58) Field of Classification Search
CPC ....... H01L 33/24; H01L 27/153; H01L 33/08; H01L 33/20; H01L 33/00; H01L 33/44
USPC ............ 257/13, 88, 85, 98, 99, 100, E33.064; 438/24, 26, 47
See application file for complete search history.

(56) References Cited

U.S. PATENT DOCUMENTS 5,252,434 A  10/1993  Blonder
5,406,095 A * 4/1995  Koyama et al. .............. 257/88
(Continued)

FOREIGN PATENT DOCUMENTS

EP  1469529  10/2004
JP  06-244458  9/1994
(Continued)

OTHER PUBLICATIONS

Non-Final Office Action issued on Sep. 17, 2013 in U.S. Appl. No. 13/862,052.
(Continued)

*Primary Examiner* — Thinh T Nguyen
(74) *Attorney, Agent, or Firm* — H.C. Park & Associates, PLC

(57) ABSTRACT

The present invention relates to a light emitting device. The light emitting device comprises a substrate, an N-type semiconductor layer formed on the substrate, and a P-type semiconductor layer formed on the N-type semiconductor layer, wherein a side surface including the N-type or P-type semiconductor layer has a slope of 20 to 80° from a horizontal plane. Further, a light emitting device comprises a substrate formed with a plurality of light emitting cells each including an N-type semiconductor layer and a P-type semiconductor layer formed on the N-type semiconductor layer, wherein the N-type semiconductor layer of one light emitting cell and the P-type semiconductor layer of another adjacent light emitting cell are connected to each other, and a side surface including at least the P-type semiconductor layer of the light emitting cell has a slope of 20 to 80° from a horizontal plane.

8 Claims, 10 Drawing Sheets

(51) Int. Cl.
*H01L 33/08* (2010.01)
*H01L 27/15* (2006.01)
*H01L 33/20* (2010.01)
*H01L 33/38* (2010.01)
*H01L 33/44* (2010.01)

(52) U.S. Cl.
CPC ............... *H01L 33/44* (2013.01); *H01L 33/08* (2013.01); *H01L 27/153* (2013.01)
USPC ............... 257/13; 257/88; 257/98; 257/99; 257/E33.064; 438/24; 438/26; 438/47

(56) References Cited

U.S. PATENT DOCUMENTS

| | | | |
|---|---|---|---|
| 5,652,434 | A | 7/1997 | Nakamura et al. |
| 5,862,167 | A | 1/1999 | Sassa et al. |
| 5,940,683 | A | 8/1999 | Holm et al. |
| 6,255,129 | B1 | 7/2001 | Lin |
| 6,472,718 | B2 | 10/2002 | Lell |
| 6,547,249 | B2 * | 4/2003 | Collins et al. ............ 257/88 |
| 6,583,442 | B2 | 6/2003 | Ito |
| 6,608,330 | B1 | 8/2003 | Yamada |
| 6,635,902 | B1 | 10/2003 | Lin |
| 6,957,899 | B2 | 10/2005 | Jiang et al. |
| 7,034,340 | B2 | 4/2006 | Yukimoto |
| 7,057,208 | B2 | 6/2006 | Akimoto et al. |
| 7,210,819 | B2 | 5/2007 | Jiang et al. |
| 7,213,942 | B2 | 5/2007 | Jiang et al. |
| 7,221,044 | B2 | 5/2007 | Fan et al. |
| 7,271,421 | B2 | 9/2007 | Yukimoto et al. |
| 7,474,681 | B2 | 1/2009 | Lin et al. |
| 7,504,772 | B2 | 3/2009 | Yukimoto et al. |
| 7,511,311 | B2 | 3/2009 | Kususe et al. |
| 7,525,248 | B1 | 4/2009 | Fan |
| 7,531,843 | B2 * | 5/2009 | Lin et al. ............ 257/90 |
| 7,535,028 | B2 * | 5/2009 | Fan et al. ............ 257/88 |
| 7,598,149 | B2 | 10/2009 | Dawson et al. |
| 2002/0109147 | A1 | 8/2002 | Shirai et al. |
| 2002/0139987 | A1 * | 10/2002 | Collins et al. ............ 257/88 |
| 2003/0010989 | A1 * | 1/2003 | Yukimoto ............ 257/88 |
| 2004/0012958 | A1 | 1/2004 | Hashimoto et al. |
| 2004/0075399 | A1 | 4/2004 | Hall |
| 2004/0080941 | A1 | 4/2004 | Jiang et al. |
| 2005/0023537 | A1 | 2/2005 | Salam |
| 2005/0082966 | A1 | 4/2005 | Yamazaki et al. |
| 2005/0110033 | A1 | 5/2005 | Heremans et al. |
| 2005/0121679 | A1 | 6/2005 | Nagahama et al. |
| 2005/0199885 | A1 | 9/2005 | Hata et al. |
| 2005/0224973 | A1 | 10/2005 | Bernier et al. |
| 2005/0225973 | A1 * | 10/2005 | Eliashevich et al. ......... 362/217 |
| 2005/0254243 | A1 | 11/2005 | Jiang et al. |
| 2006/0043433 | A1 | 3/2006 | Matsushita |
| 2006/0044864 | A1 | 3/2006 | Lin et al. |
| 2006/0169993 | A1 | 8/2006 | Fan et al. |
| 2007/0114542 | A1 | 5/2007 | Yamazaki et al. |
| 2008/0230765 | A1 | 9/2008 | Yoon et al. |
| 2010/0006870 | A1 | 1/2010 | Lee et al. |

FOREIGN PATENT DOCUMENTS

| | | |
|---|---|---|
| JP | 07-153993 | 6/1995 |
| JP | 11-150303 | 6/1999 |
| JP | 2001-156331 | 6/2001 |
| JP | 2001-185755 | 7/2001 |
| JP | 2002-026378 | 1/2002 |
| JP | 2002-043633 | 2/2002 |
| JP | 2002-237646 | 8/2002 |
| JP | 2003-017740 | 1/2003 |
| JP | 2004-006582 | 1/2004 |
| JP | 2004-071644 | 3/2004 |
| JP | 2004-079867 | 3/2004 |
| JP | 2004-273746 | 9/2004 |
| JP | 2004-311677 | 11/2004 |
| JP | 2005-019874 | 1/2005 |
| JP | 2005-117020 | 4/2005 |
| JP | 2005-136130 | 5/2005 |
| JP | 2005-142278 | 6/2005 |
| KR | 10-2003-0022940 | 3/2003 |
| KR | 10-2003-0052499 | 6/2003 |
| KR | 10-2004-0005098 | 1/2004 |
| KR | 10-2005-0052474 | 6/2005 |
| KR | 10-2005-0066358 | 6/2005 |
| KR | 10-2006-0037589 | 5/2006 |
| WO | 2004/013916 | 2/2004 |
| WO | 2004/023568 | 3/2004 |
| WO | 2005/008791 | 1/2005 |
| WO | 2005/050748 | 6/2005 |

OTHER PUBLICATIONS

Notice of Allowance issued on Jan. 15, 2014 in U.S. Appl. No. 13/862,052.
International Search Report issued on Oct. 18, 2006 in PCT/KR2006/002427.
Non-Final Office Action issued on Feb. 5, 2010 in U.S. Appl. No. 11/993,965.
Non-Office Action issued on Feb. 1, 2010 in U.S. Appl. No. 12/568,630.
European Search Report dated on Feb. 10, 2010 in European Patent Application No. 06769008.1.
Final Office Action issued on Jun. 29, 2010 in U.S. Appl. No. 11/993,965.
Non-Office Action issued on Dec. 9, 2010 in U.S. Appl. No. 12/630,370.
Non-Office Action issued on Dec. 23, 2010 in U.S. Appl. No. 12/613,275.
Notice of Allowance issued on Mar. 25, 2011 in U.S. Appl. No. 12/613,275.
Notice of Allowance issued on May 6, 2011 in U.S. Appl. No. 12/630,370.
Non-Final Office Action issued on Jun. 14, 2012 in U.S. Appl. No. 11/993,965.
European Office Action dated on Apr. 11, 2012 in European Patent Application No. 09 014 468.4.
European Office Action dated on Apr. 17, 2012 in European Patent Application No. 06769008.1.
Final Office Action issued on Dec. 21, 2012 in U.S. Appl. No. 11/993,965.
Notice of Allowance issued on Mar. 6, 2013 in U.S. Appl. No. 11/993,965.
Notice of Allowance issued on Apr. 12, 2010 in U.S. Appl. No. 12/568,630.

* cited by examiner

LIGHT EMITTING DEVICE AND METHOD OF MANUFACTURING THE SAME

CROSS REFERENCE TO RELATED APPLICATIONS

This application is a continuation of U.S. patent application Ser. No. 13/862,052, filed on Apr. 12, 2013, which is a continuation of U.S. application Ser. No. 11/993,965, filed on Dec. 26, 2007, now U.S. Pat. No. 8,476,648, which is the national stage of International Application No. PCT/KR2006/002427, filed on Jun. 22, 2006, and claims priority from and the benefit of Korean Patent Application No. 10-2005-0053797, filed on Jun. 22, 2005, Korean Patent Application No. 10-2005-0055179, filed on Jun. 24, 2005, and Korean Patent Application No. 10-2006-0021801, filed on Mar. 8, 2006, which are hereby incorporated by reference for all purposes as if fully set forth herein.

BACKGROUND OF THE INVENTION

1. Field of Invention

The present invention relates to a light emitting device and a method of manufacturing the same. More particularly, the present invention relates to a nitride based semiconductor light emitting device with enhanced luminous efficiency and brightness and a method of manufacturing the light emitting device.

2. Description of the Related Art

A light emitting device refers to an element in which minority carriers (electrons or holes) injected using a p-n junction structure of a semiconductor are produced and certain light is emitted due to recombination of the carriers. A light emitting source is formed from any one or combination of compound semiconductor materials such as GaAs, AlGaAs, GaN, InGaN and AlGaInP, so that a variety of colors can be implemented. For example, a red light emitting device may be formed from GaAsP or the like; a green light emitting device may be formed from GaP, InGaN or the like; a blue light emitting device may be formed using an InGaN/GaN double hetero structure; and a UV light emitting device may be formed using an AlGaN/GaN or AlGaN/AlGaN structure.

In particular, GaN has a direct bandgap of 3.4 eV at a normal temperature and a direct energy bandgap of 1.9 eV (InN) to 3.4 eV (GaN) or 6.2 eV (AlN) by combining with a substance such as InN or AlN. Thus, GaN is a substance with great applicability to an optical element due to its broad wavelength range from visible light to ultraviolet light. Since the wavelength can be adjusted in such a manner, full-color implementation can be made by means of red, green and blue light emitting devices with a short wavelength range, so that the applicability to a general illumination market as well as a display device market is expected to be greatly increased.

Light emitting devices have characteristics of lower power consumption, longer lifespan, better installation in a narrow space and stronger resistance against vibration as compared with existing bulbs or fluorescent lamps. Since the light emitting devices are used as display devices and backlights and have superior characteristics in view of the reduction in power consumption and the durability, many studies for applying the light emitting devices to a general illumination field have been recently conducted. In the future, their applicability is expected to extend to a backlight of a large-sized LCD-TV, a vehicle headlight and general illumination. To this end, it is necessary to improve luminous efficiency of light emitting devices, solve a heat dissipation problem, and achieve high brightness and output of the light emitting devices.

Many techniques for enhancing the performance of light emitting devices have been currently developed. There are various indexes indicating the performance of light emitting devices, such as luminous efficiency (lm/W), internal quantum efficiency (%), external quantum efficiency (%) and extraction efficiency (%). The extraction efficiency is determined as a ratio of electrons injected into the light emitting device to photons emitted to the outside of the light emitting device. That is, the light emitting device becomes bright as the extraction efficiency becomes high. Since the extraction efficiency of the light emitting device is much influenced by the shape and surface pattern of a chip, the structure of a chip and a packaging type, careful attention should be paid when designing the light emitting device.

FIG. 1 is a sectional view showing a conventional light emitting device with a horizontal structure.

Referring to FIG. 1, the light emitting device comprises a substrate 1, an N-type is semiconductor layer 2 formed on the substrate 1, an active layer 3 formed on a portion of the N-type semiconductor layer 2 and a P-type semiconductor layer 4. That is, after the N-type semiconductor layer 2, the active layer 3 and the P-type semiconductor layer 4 have been sequentially formed on the substrate 1, predetermined regions of the P-type semiconductor layer 4 and the active layer 3 are etched to expose a portion of the N-type semiconductor layer 2. Then, a predetermined voltage is applied to top surfaces of the exposed N-type semiconductor layer 2 and the P-type semiconductor layer 4.

FIG. 2 is a sectional view showing a conventional light emitting device with a flip chip structure.

Referring to FIG. 2, the light emitting device comprises an N-type semiconductor layer 2, an active layer 3 and a P-type semiconductor layer 4, which are sequentially formed on a base substrate 1. The light emitting device further comprises a submount substrate 5 onto which the base substrate 1 is flip-chip bonded using metal bumps 8 and 9. To this end, the N-type semiconductor layer 2, the active layer 3 and the P-type semiconductor layer 4 are sequentially formed on the predetermined substrate 1, and portions of the P-type semiconductor layer 4 and the active layer 3 are etched to expose the N-type semiconductor layer 2 such that a light emitting cell can be formed. Further, the additional submount substrate 5 is prepared to form first and second electrodes 6 and 7 thereon, and the P-type and N-type metal bumps 8 and 9 are then formed on the first and second electrodes 6 and 7, respectively. Thereafter, the light emitting cell is bonded with the submount substrate 5 such that P and N electrodes of the light emitting cell are bonded with the P-type and N-type metal bumps 8 and 9, respectively, to fabricate a light emitting device. Since such a conventional light emitting device with a flip chip structure has high heat dissipation efficiency and hardly has shield of light, there is an is advantage in that its light efficiency is increased by 50% or more as compared with a conventional light emitting device. Further, since a gold wire for driving a light emitting device is not necessary, many applications to a variety of small-sized packages can be considered.

Light produced from a light emitting layer of a light emitting device is emitted from all the surfaces of a chip, and light extraction efficiency is generally determined by a critical angle of light. However, when the conventional light emitting device is etched to expose an N-type semiconductor layer, side surfaces of the P-type semiconductor layer and the active layer are vertically processed such that a portion of light produced within the light emitting device is totally reflected on the etched surface that is processed vertically from a horizontal plane. Then, a considerable amount of light to be totally reflected is not emitted to the outside but dissipated within the light emitting device due to the internal reflection. That is, there is a problem in that luminous efficiency in which electric energy is converted into light energy and the light is then emitted to the outside of a light emitting device is low.

SUMMARY OF THE INVENTION

The present invention is conceived to solve the aforementioned problems. Accordingly, an object of the present invention is to provide a light emitting device for emitting light with high luminous intensity and brightness by enhancing characteristics of luminous efficiency, external quantum efficiency, extraction efficiency and the like and improving reliability, and a method of manufacturing the light emitting device.

According to an aspect of the present invention for achieving the objects, there is provided a light emitting device, comprising a plurality of light emitting cells each including an N-type semiconductor layer and a P-type semiconductor layer formed on a portion of the N-type is semiconductor layer on a substrate. The N-type semiconductor layer of one light emitting cell and the P-type semiconductor layer of another adjacent light emitting cell may be connected to each other, and a side surface including the N-type or P-type semiconductor layer of the light emitting cell has a slope of 20 to 80° from a horizontal plane. The light emitting device may further comprise a wire for connecting the N-type semiconductor layer of one light emitting cell and the P-type semiconductor layer of another adjacent light emitting cell, a transparent electrode layer on the P-type semiconductor layer, and P-type and N-type ohmic metal layers containing Cr or Au on the P-type and N-type semiconductor layers, respectively.

According to another aspect of the present invention, there is provided a light emitting device comprising a substrate formed with a plurality of light emitting cells each including an N-type semiconductor layer and a P-type semiconductor layer formed on the N-type semiconductor layer and a submount substrate flip-chip bonded onto the substrate. Preferably, the N-type semiconductor layer of one light emitting cell and the P-type semiconductor layer of another adjacent light emitting cell are connected to each other, and a side surface including at least the P-type semiconductor layer of the light emitting cell has a slope of 20 to 80° from a horizontal plane. The light emitting device may further comprise a wire for connecting the N-type semiconductor layer of one light emitting cell and the P-type semiconductor layer of another adjacent light emitting cell.

According to further aspect of the present invention, there is provided a method of manufacturing a light emitting device, comprising the steps of sequentially forming N-type and P-type semiconductor layers on a substrate; forming an etching mask pattern, of which side surface is not perpendicular to but inclined at a predetermined slope from a horizontal plane, on the P-type semiconductor layer; and removing the etching mask pattern and the P-type is semiconductor layer exposed through the etching mask pattern.

According to still further aspect of the present invention, there is a method of manufacturing a light emitting device comprising the steps of removing a portion of the N-type semiconductor layer exposed due to the removal of the P-type semiconductor layer to form a plurality of light emitting cells; and connecting the N-type semiconductor layer of one light emitting cell and the P-type semiconductor layer of another adjacent light emitting cell through a conductive wire.

According to still further aspect of the present invention, there is a method of manufacturing a light emitting device comprising the step of flip-chip bonding the substrate onto an additional submount substrate after the step of removing the P-type semiconductor layer and the etching mask pattern. The method of manufacturing a light emitting device may further comprise the steps of removing a portion of the N-type semiconductor layer exposed through the removal of the P-type semiconductor layer to form a plurality of light emitting cell; and connecting the N-type semiconductor layer of one light emitting cell and the P-type semiconductor layer of another adjacent light emitting cell through a conductive wire, after the step of removing the P-type semiconductor layer and the etching mask pattern.

The step of forming the plurality of light emitting cells may comprise the steps of forming an etching mask pattern, of which side surface is not perpendicular to but inclined at a predetermined slope from a horizontal plane, on the P-type semiconductor layer; removing the N-type and P-type semiconductor layers exposed through the etching mask pattern to form a plurality of light emitting cells; and removing the etching mask pattern.

The N type semiconductor layer of one light emitting cell and the P type semiconductor layer of another adjacent light emitting cell may be connected with the is conductive wire through a bridge or step coverage process.

A photoresist with a thickness of 3 to 50 μm may be used in the step of forming the etching mask pattern. The step of forming the etching mask pattern may comprise the steps of: applying the photoresist onto the P-type semiconductor layer; light exposing the photoresist in accordance with a predetermined mask pattern; and developing the light-exposed photoresist without a baking process after the light exposure. The step of forming the etching mask pattern may comprise the steps of: applying the photoresist onto the P-type semiconductor layer; light exposing the photoresist in accordance with a predetermined mask pattern; hard baking the light-exposed photoresist at a temperature of 100 to 140° C.; and developing the hard-baked photoresist.

After the step of removing the P-type semiconductor layer and the etching mask pattern, the method of manufacturing a light emitting device may further comprise the steps of removing a rear surface of the substrate at a certain thickness; and depositing Al, Ti, Ag, W, Ta, Ni, Ru or an alloy thereof onto the rear surface of the substrate.

In a light emitting device and a method of manufacturing the same according to the present invention, light produced from a side surface of a semiconductor layer, which is not perpendicular to but inclined at a predetermined slop from a horizontal plane, is not totally reflected but emitted to the outside of the light emitting device. Therefore, more enhanced characteristics of light extraction efficiency, external quantum efficiency, luminous efficiency or the like can be obtained. Further, a light emitting device of the present invention emits light with high luminous intensity and brightness and can be applied to a variety of products in which a superior light characteristic is necessary.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE PREFERRED EMBODIMENTS

Hereinafter, a light emitting device and a manufacturing method thereof according to the present invention will be described in detail with reference to the accompanying drawings. However, the present invention is not limited to the embodiments set forth herein but can be implemented in different forms. Rather, the preferred embodiments are merely provided to allow the present invention to be completely described herein and to fully convey the scope of the invention to those skilled in the art.

Figure 1:
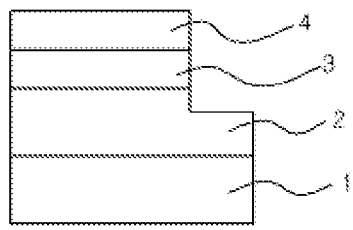
FIGS. 1 and 2 are sectional views showing conventional light emitting devices, respectively.
Figure 2:
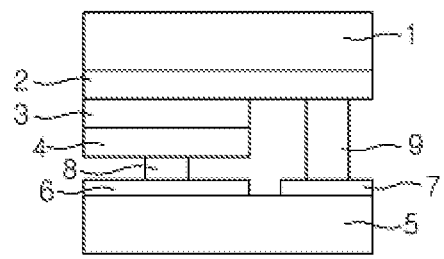
Figure 3:
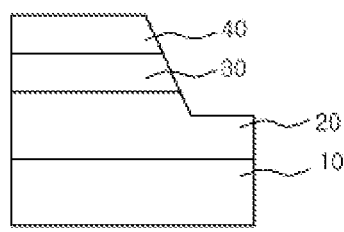
FIG. 3 is a conceptual sectional view illustrating a light emitting device with a horizontal structure according to the present invention.

FIG. 3 is a conceptual sectional view illustrating a light emitting device with a horizontal structure according to the present invention.

Referring to FIG. 3, the light emitting device comprises a substrate 10, and an N-type semiconductor layer 20, an active layer 30 and a P-type semiconductor layer 40, which are sequentially formed on the substrate 10. Each of side surfaces of the P-type semiconductor layer 40, the active layer 30 and a portion of the N-type semiconductor layer 20 has a slope of 80 to 20° from a horizontal plane such that a critical angle of light can be changed by such surfaces and light can be easily extracted. Therefore, luminous efficiency of a light emitting device can be improved.

Figure 4:
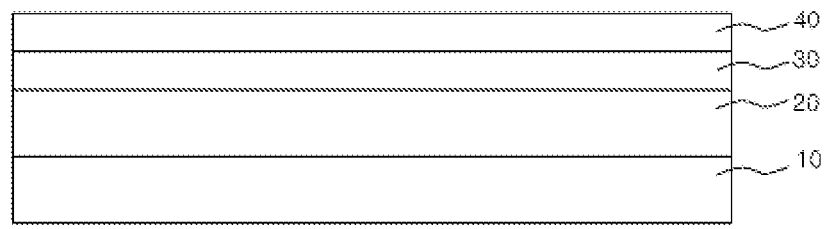
FIGS. 4 and 5 are sectional views illustrating a process of manufacturing a light emitting device according to a first embodiment of the present invention.
Figure 5:
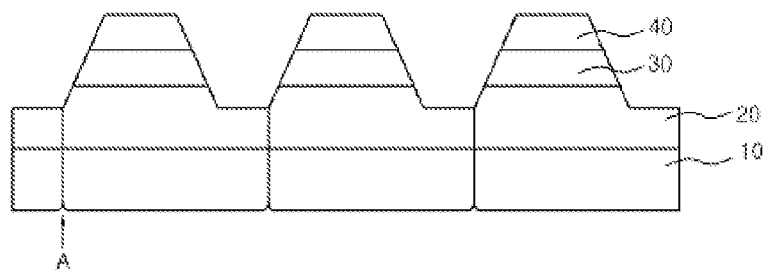

FIGS. 4 and 5 are sectional views illustrating a process of manufacturing a light emitting device according to a first embodiment of the present invention.

Referring to FIG. 4, an N-type semiconductor layer 20, an active layer 30 and a P-type semiconductor layer 40 are sequentially formed on a substrate 10.

The substrate 10 refers to a general wafer used for fabricating a light emitting device and is made of at least any one of $Al_2O_3$, SiC, ZnO, Si, GaAs, GaP, $LiAl_2O_3$, BN, AlN and GaN. In this embodiment, a crystal growth substrate made of sapphire is used.

A buffer layer (not shown) may be further formed on the substrate 10 to reduce lattice mismatch between the substrate 10 and the subsequent layers upon growth of crystals. The buffer layer may contain GaN or AlN that is a semiconductor material.

The N-type semiconductor layer 20 is a layer in which electrons are produced and is preferably made from GaN doped with N-type impurities. However, the N-type semiconductor layer 20 is not limited thereto but may use a material layer having a variety of semiconductor properties. The N-type semiconductor layer 20 including N-type $Al_xGa_{1-x}N$ ($0 \leq x \leq 1$) is formed in this embodiment. Further, the P-type semiconductor layer 40 is a layer in which holes are produced and is preferably made from GaN doped with P-type impurities. However, the P-type semiconductor layer 40 is not limited thereto but may use a material layer with a variety of semiconductor properties. The P-type semiconductor layer 40 including P-type $Al_xGa_{1-x}N(0 \leq x \leq 1)$ is formed in this embodiment. Moreover, InGaN may be used as the semiconductor layer. Further, each of the N-type and P-type semiconductor layers 20 and 40 may be formed as a multiple layer.

The active layer 30 has a predetermined bandgap and is a region where a quantum well is formed so that electrons and holes are recombined. The active layer 30 may contain InGaN. The wavelength of light emitted through the combination of electrons and holes varies according to the kind of a material constituting the active layer 30. Therefore, it is preferred that a semiconductor material contained in the active layer 30 be controlled depending on a target wavelength.

The aforementioned material layers are formed through a variety of deposition and growth methods including MOCVD (Metal Organic Chemical Vapor Deposition), CVD (Chemical Vapor Deposition), PCVD (Plasma-enhanced Chemical Vapor Deposition), MBE (Molecular Beam Epitaxy), HVPE (Hybride Vapor Phase Epitaxy) and the like.

Thereafter, portions of the P-type semiconductor layer 40 and the active layer 30 are removed through a predetermined etching process to expose a portion of the N-type semiconductor layer 20. An etching mask pattern is formed on the P-type semiconductor layer 40, and the P-type semiconductor layer 40 and the active layer 30 are then removed through a dry or wet etching process to expose the N-type semiconductor layer 20.

Generally, in order to perform the etching process, a photoresist has been applied onto a top surface of the P-type semiconductor layer 40 at a thickness of 1 to 2 μm, and then soft-baked at a temperature of 80 to 90° C. is performed. Next, an exposure process in which light in a UV range is irradiated through a predetermined photo mask to transfer a pattern formed on the mask to the applied photoresist is executed. Thereafter, the photoresist is hard-baked at a temperature of 100 to 120° C., and a developing process in which the photoresist at a portion with relatively weak combination through the exposure process is melted using a solvent is executed. A predetermined etching mask pattern is formed on the P-type semiconductor layer 40 through the above process.

However, in this embodiment, the photoresist is applied at a thickness of 3 to 50 μm which is thicker as compared with the prior art when the etching mask pattern is formed, and the exposure process is performed after the soft-baking. Next, if the photoresist is directly developed without the hard-baking, a developed side surface of the remaining photoresist is formed into an inclined surface not perpendicular (90°) to but inclined at a predetermined slope from a horizontal plane.

Subsequently, if exposed regions of the P-type semiconductor layer 40, the active layer 30 and the predetermined N-type semiconductor layer 20 are etched using the etching mask pattern with such a slope of the side surface, the side surfaces of the etched P-type semiconductor layer 40, active layer 30 and N-type semiconductor layer 20 can be similarly formed into an inclined surface not perpendicular (90°) to but inclined at a predetermined slope from the horizontal plane.

That is, after the photoresist has been applied at a thickness of 3 to 50 μm on the P-type semiconductor layer 40 of FIG. 4 and light-exposed, a developed etching mask pattern is immediately formed without the hard-baking. The P-type semiconductor layer 40 and the active layer 30, which are exposed through the etching mask pattern, are removed through an ICP (Inductive Coupled Plasma) or dry etching process to expose the N-type semiconductor layer 20. A portion of the exposed N-type semiconductor layer 20 may be further removed. Thereafter, if the etching mask pattern is removed, a light emitting device in which the side surfaces of the P-type semiconductor layer 40, the active layer 30 and a portion of the N-type semiconductor layer 20 are not perpendicular (90°) to but inclined at the predetermined slope from a horizontal plane can be manufactured as shown in FIG. 5.

Alternatively, after a photoresist has been applied at a thickness of 3 to 50 μm on the P-type semiconductor layer 40 of FIG. 4 and light-exposed, hard-baking may be performed. In such a case, if the photoresist is hard-baked at a temperature of 100 to 140° C. and then developed, the side surface of the developed photoresist may be etched to have a slope of 80 to 20° from a horizontal plane. For example, in a case where the hard-baking is performed at a temperature of 100° C., an etching mask pattern with a slope of about 80° from the horizontal plane can be obtained, and the side surfaces of the P-type semiconductor layer 40, the active layer 30 and a portion of the N-type semiconductor layer 20 can have a slope of about 80° from the horizontal plane using the etching mask pattern. Further, in a case where the hard-baking is performed at a temperature of 140° C., an etching mask pattern with a slope of about 20° from the horizontal plane can be obtained, and the side surfaces of the P-type semiconductor layer 40, the active layer 30 and a portion of the N-type semiconductor layer 20 can have a slope of about 20° from the horizontal plane using the etching mask pattern.

The etching mask pattern, which the photoresist with a thickness of 3 to 50 μm has been light-exposed and hard-baked at a temperature of 100 to 140° C. and then developed in such a manner, can be used such that the side surfaces of the etched the P-type semiconductor layer 40, active layer 30 and predetermined N-type semiconductor layer 20 have a slope of 80 to 20° from a horizontal plane similarly to the etching mask pattern. Then, light produced within a light emitting layer is not totally reflected on the etched side surface with a variety of slopes but emitted to the outside of a light emitting device.

A transparent electrode layer may be further formed on the P-type semiconductor layer 40 to reduce resistance of the P-type semiconductor layer 40 and enhancing transmittance of light, and an additional ohmic metal layer may be further formed on the P-type semiconductor layer 40 or the exposed N-type semiconductor layer 20 to facilitate current supply. The transparent electrode layer may be made of ITO (Indium Tin Oxide), ZnO or a transparent conductive metal, and the ohmic metal layer may be made of Cr or Au. Further, for the is application of voltage, a P-type electrode may be further formed on the P-type semiconductor layer 40 and an N-type electrode may be further formed on the N-type semiconductor layer 20.

Further, in order to enhance the heat dissipation characteristic of a light emitting device, after a rear surface of the substrate 10 has been removed at a predetermined thickness, Al, Ti, Ag, W, Ni, Ta, Ru or an alloy thereof may be deposited on the rear surface of the substrate 10.

As can be seen from this figure, a plurality of light emitting devices may be fabricated on a single substrate 10, which is cut into the individual light emitting devices. At this time, portions A shown in FIG. 5 are cutting portions used for individually cutting the plurality of light emitting devices.

Accordingly, a light emitting device in which the side surfaces of the P-type semiconductor layer 40, the active layer 30 and a portion of the N-type semiconductor layer 20 is not perpendicular (90°) to but inclined at the predetermined slope from a horizontal plane can be manufactured.

The aforementioned process of manufacturing a light emitting device according to the present invention is merely a specific embodiment, but is not limited thereto. Various processes and manufacturing methods may be modified or added depending on the characteristics of devices and the convenience of processes.

Figure 6:
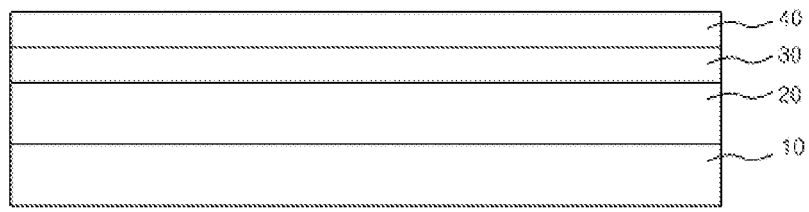
FIGS. 6 to 9 are sectional views illustrating a process of manufacturing a light emitting device according to a second embodiment of the present invention.
Figure 7:
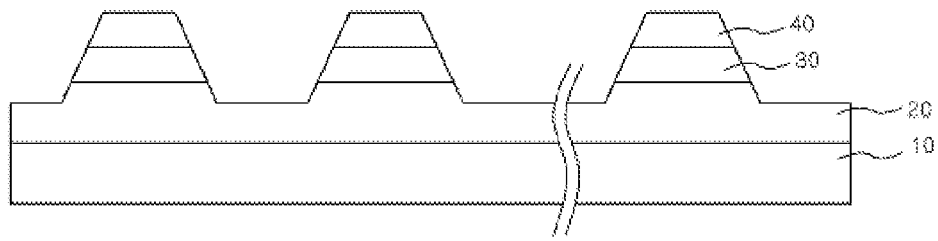

FIGS. 6 to 7 are sectional views illustrating a process of manufacturing a light emitting device according to a second embodiment of the present invention.

The second embodiment of the present invention is almost the same as the first embodiment. In the second embodiment, however, there is provided a light emitting device in which a plurality of light emitting cells are connected in series, parallel or series-parallel in a wafer level to reduce the size of the device, and they can be driven at proper voltage and current is to be used for illustration purpose and can also be driven even with an AC power source. Descriptions overlapping with the previous embodiment will be omitted herein.

Referring to FIG. 6, an N-type semiconductor layer 20, an active layer 30 and a P-type semiconductor layer 40 are sequentially formed on a substrate 10 through various deposition methods including MOCVD (Metal Organic Chemical Vapor Deposition), CVD (Chemical Vapor Deposition), PCVD (Plasma-enhanced Chemical Vapor Deposition), MBE (Molecular Beam Epitaxy), HVPE (Hybride Vapor Phase Epitaxy) and the like. A buffer layer may be further formed on the substrate 10 to reduce lattice mismatch between the substrate 10 and the subsequent layers upon growth of crystals.

Thereafter, portions of the P-type semiconductor layer 40 and the active layer 30 are removed through a predetermined etching process to expose a portion of the N-type semiconductor layer 20. That is, after the photoresist has been applied at a thickness of 3 to 50 μm on the P-type semiconductor layer 40 of FIG. 6 and light-exposed, it is developed without hard-baking to form an etching mask pattern. The P-type semiconductor layer 40 and the active layer 30, which are exposed through the etching mask pattern, are removed through an ICP (Inductive Coupled Plasma) or dry etching process to expose the N-type semiconductor layer 20. A portion of the exposed N-type semiconductor layer 20 may be further removed. Thereafter, if the etching mask pattern is removed, a light emitting device in which the side surfaces of the P-type semiconductor layer 40, the active layer 30 and the N-type semiconductor layer 20 are not perpendicular (90°) to but inclined at the predetermined slope from a horizontal plane can be manufactured as shown in FIG. 7.

Alternatively, after a photoresist has been applied in a thickness of 3 to 50 μm on the P-type semiconductor layer 40 of FIG. 6 and light-exposed, it is hard-baked at a temperature is of 100 to 140° and developed such that an etching mask pattern can be formed. After the P-type semiconductor layer 40 and the active layer 30, which are exposed through the etching mask pattern, have been etched, the etching mask pattern is removed such that the side surfaces of the etched P-type semiconductor layer 40 and active layer 30 can have a variety of slopes of 80 to 20°.

Figure 8:
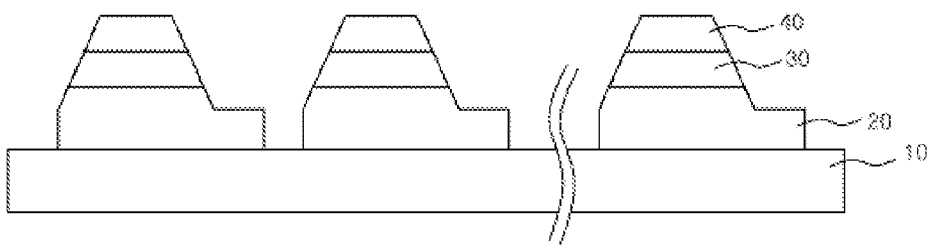

Next, in order to form a plurality of light emitting cells on the substrate 10, predetermined regions of the exposed N-type semiconductor layer 20 are removed such that a portion of the substrate 10 can be exposed. To this end, a predetermined mask pattern is formed on all the portions except the predetermined regions where the substrate 10 will be exposed, and regions of the N-type semiconductor layer 20 that are exposed through the mask pattern are then etched such that the plurality of light emitting cells can be electrically isolated from one another as shown in FIG. 8. At this time, the mask pattern whose side surface is inclined through the aforementioned process is formed and then used to etch the exposed N-type semiconductor layer 20 such that the side surfaces of the P-type semiconductor layer 20 and the active layer 30 are not perpendicular to but inclined at a predetermined slope from a horizontal plane.

Figure 9:
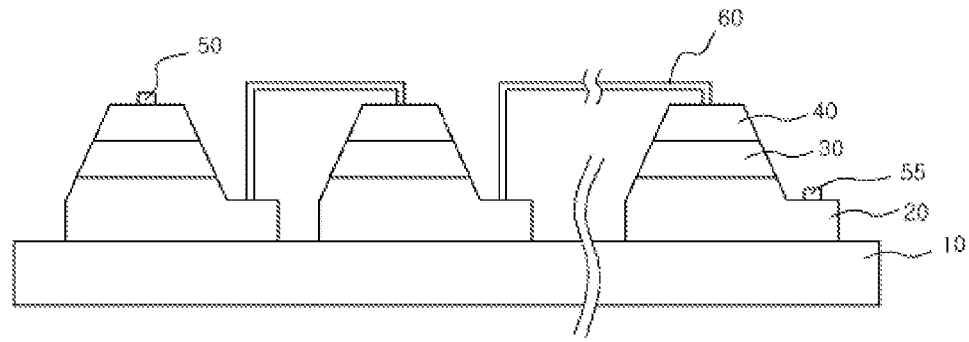

Referring to FIG. 9, the N-type semiconductor layer 20 of a light emitting cell and the P-type semiconductor layer 40 of the adjacent light emitting cell are connected through a predetermined wiring process. That is, the exposed N-type semiconductor layer 20 of one light emitting cell and the P-type semiconductor layer 40 of another adjacent light emitting cell are connected through a wire 60. At this time, the conductive wire 60 for electrically connecting the N-type and P-type semiconductor layers 20 and 40 are formed through a bridge process.

The aforementioned bridge process is also called an air-bridge process. In the is air-bridge process, a photosensitive liquid is applied between chips to be connected with each other through a photo process and developed to form a photoresist pattern, a material such as metal is first formed into a thin film on the photoresist pattern through a vacuum vapor deposition method or the like, and a conductive material containing gold (Au) is applied at a predetermined thickness onto the thin film through an electroplating, electroless plating or metal vapor deposition method. Thereafter, if the photoresist pattern is removed with a solution of a solvent or the like, a lower portion of the conductive material is completely removed, and thus, only the bridge-shaped conductive material is formed in a space between the adjacent light emitting cells.

The wire 60 may be made of not only metal but also all kinds of conductive materials. It will be apparent that a silicone compound doped with impurities may be used.

Further, in order to apply an external voltage to the light emitting device, a P-type bonding pad 50 is formed on the P-type semiconductor layer 40 of the light emitting cell positioned at one edge of the substrate 10 and an N-type bonding pad 55 is formed on the exposed N-type semiconductor layer 20 of the light emitting cell positioned at the other edge of the substrate 10.

The aforementioned process of manufacturing a light emitting device according to the present invention is merely a specific embodiment but is not limited thereto. Various modifications can be made or various material films can be further added. For example, in order to enhance the heat dissipation characteristic of a light emitting device, after a rear surface of the substrate 10 has been removed at a predetermined thickness, Al, Ti, Ag, W, Ni, Ta, Ru or an alloy thereof may be deposited on the rear surface of the substrate 10.

Accordingly, a light emitting device in which the plurality of light emitting cells is each of which side surfaces of the P-type semiconductor layer 40, the active layer 30 and a portion of the N-type semiconductor layer 20 are not perpendicular (90°) to but inclined at predetermined slope from a horizontal plane are connected with one another can be manufactured.

FIGS. 10 to 13 are sectional views illustrating a process of manufacturing a light emitting device according to a third embodiment of the present invention.

The third embodiment is almost the same as the second embodiment. In the second embodiment, the N-type semiconductor layer 20 is first exposed and a portion of the exposed N-type semiconductor layer 20 is then removed to separate the light emitting cells from one another. In the third embodiment, however, a plurality of light emitting cells are first separated, and a portion of an N-type semiconductor layer 20 is then exposed. Descriptions overlapping with the previous embodiments will be omitted herein.

Figure 10:
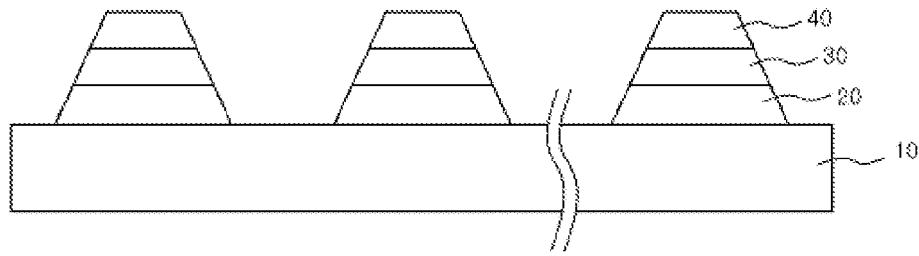
FIGS. 10 to 13 are sectional views illustrating a process of manufacturing a light emitting device according to a third embodiment of the present invention.

Referring to FIG. 10, portions of an N-type semiconductor layer 20, an active layer 30 and a P-type semiconductor layer 40, which are sequentially formed on a substrate 10, are removed to form a plurality of light emitting cells. To this end, after a photoresist has been applied at a thickness of 3 to 50 μm on the P-type semiconductor layer 40 and light-exposed, it is immediately developed without hard-baking such that an etching mask pattern can be formed. The portions of the P-type semiconductor layer 40, the active layer 30 and the N-type semiconductor pattern 20, which are exposed through the etching mask pattern, and the etching mask pattern is removed to separate the light emitting cells from one another. Accordingly, a light emitting device in which entire side surfaces of the P-type semiconductor layer 40, the active layer 30 and the N-type semiconductor layer 20 are not perpendicular (90°) to but inclined at a predetermined slope can be obtained as shown in this figure. Further, the P-type is semiconductor layer 40, the active layer 30 and the N-type semiconductor layer 20 are removed using the etching mask pattern in which a photoresist is applied at a thickness of 3 to 50 μm on the P-type semiconductor layer 40 and light-exposed and hard-baked at a temperature of 100 to 140° and then developed. Accordingly, the entire side surfaces of the P-type semiconductor layer 40, the active layer 30 and the N-type semiconductor layer 20 can be formed at various slopes of 80 to 20°.

Figure 11:
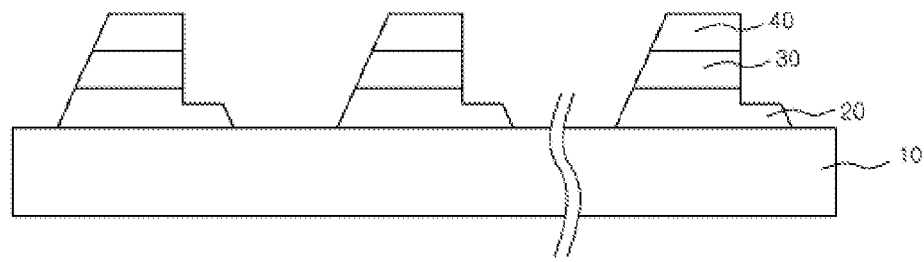

Thereafter, as shown in FIG. 11, portions of the P-type semiconductor layer 40 and the active layer 30 are removed to expose a portion of the N-type semiconductor layer 20 through a predetermined etching process.

Figure 12:
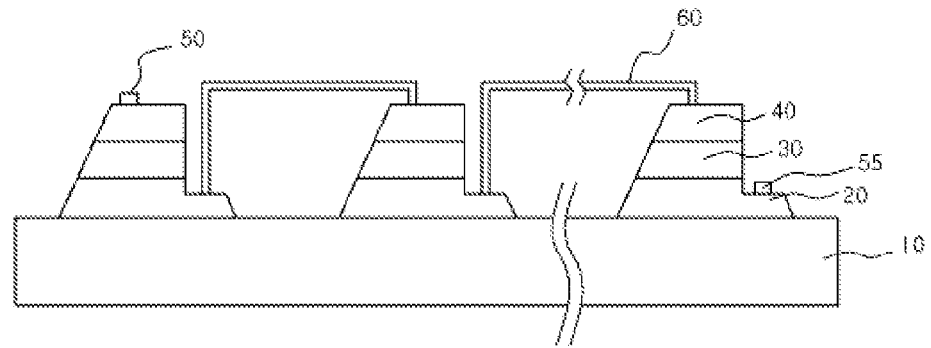

Referring to FIG. 12, the N-type semiconductor layer 20 of one light emitting cell and the P-type semiconductor layer 40 of another adjacent light emitting cell are connected with each other through a bridge process.

Further, in order to apply an external voltage to the light emitting device, a P-type bonding pad 50 is formed on the P-type semiconductor layer 40 of the light emitting cell positioned at one edge of the substrate 10 and an N-type bonding pad 55 is formed on the exposed N-type semiconductor layer 20 of the light emitting cell positioned at the other edge of the substrate 10.

The aforementioned process of manufacturing a light emitting device according to the present invention is merely a specific embodiment but is not limited thereto. Various modifications can be made and various material films may be further added. For example, in order to enhance the heat dissipation characteristic of a light emitting device, after a rear surface of the substrate 10 has been removed at a predetermined thickness, Al, Ti, Ag, W, Ni, Ta, Ru or an alloy thereof may be deposited on the rear surface of the substrate 10.

Figure 13:
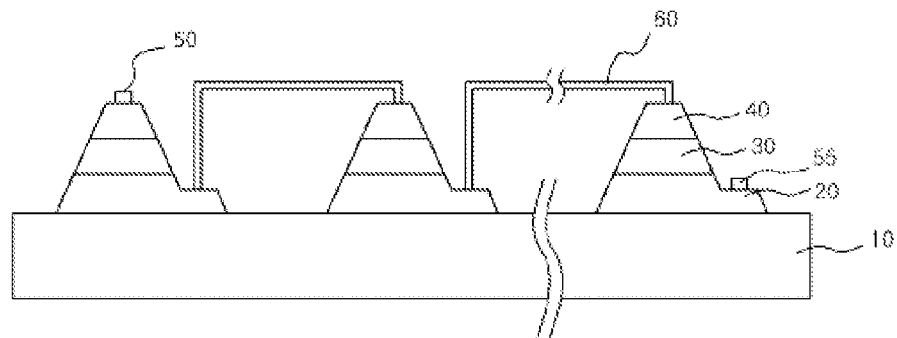

Further, even in a case where the plurality of light emitting cells are separated by etching such that the side surfaces may have various slopes as shown in FIG. 10 and then etched to expose the N-type semiconductor layer 20, a light emitting device can be manufactured using the same etching process as described above. That is, as shown in FIG. 13, the side surfaces of the P-type semiconductor layer 40 and the active layer 30, which are etched to expose the N-type semiconductor layer 20, can be formed at various slopes.

Accordingly, a light emitting device in which the plurality of light emitting cells each of which side surfaces of the P-type semiconductor layer 40, the active layer 30 and the N-type semiconductor layer 20 are not perpendicular (90°) to but inclined at predetermined slope from a horizontal plane are connected with one another can be manufactured.

FIGS. 14 to 17 are sectional views illustrating a process of manufacturing a light emitting device according to a fourth embodiment of the present invention.

The fourth embodiment is almost the same as the third embodiment. In the third embodiment, a conductive wire for electrically connecting the N-type semiconductor layer of one light emitting cell and the P-type semiconductor layer of another adjacent light emitting cell is formed through a bridge process. In the fourth embodiment, however, the conductive wire is formed through a step coverage process. Descriptions overlapping with the previous embodiments will be omitted herein.

Figure 14:
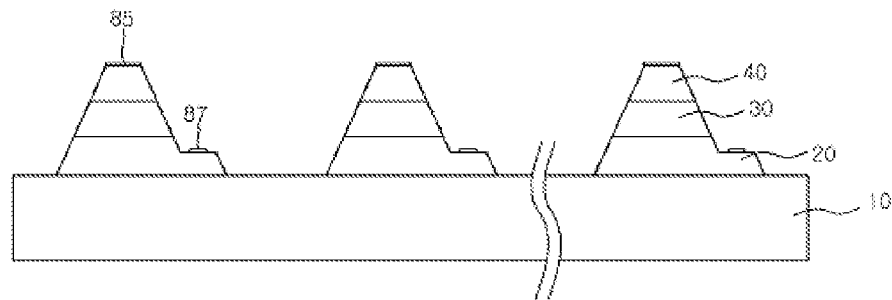
FIGS. 14 to 17 are sectional views illustrating a process of manufacturing a light emitting device according to a fourth embodiment of the present invention.

Referring to FIG. 14, even in a case where a plurality of light emitting cells are separated by etching such that the side surfaces may have various slopes and then etched to expose an N-type semiconductor layer 20 through the aforementioned process, the side surfaces of P-type semiconductor layer 40 and active layer 30, which are etched to expose the N-type semiconductor layer 20, are formed with various slopes. Further, in order to reduce the is resistance of the P-type semiconductor layer 40 and enhance the transmittance of light, a transparent electrode layer 85 may be further formed on a top surface of the P-type semiconductor layer 40. Further, an additional ohmic metal layer 87 for facilitating the supply of current may be further formed on a top surface of the P-type semiconductor layer 40 or the exposed N-type semiconductor layer 20. The transparent electrode layer 85 may be made of ITO (Indium Tin Oxide), ZnO or a conductive transparent metal, and the ohmic metal layer 87 may be made of Cr or Au.

Figure 15:
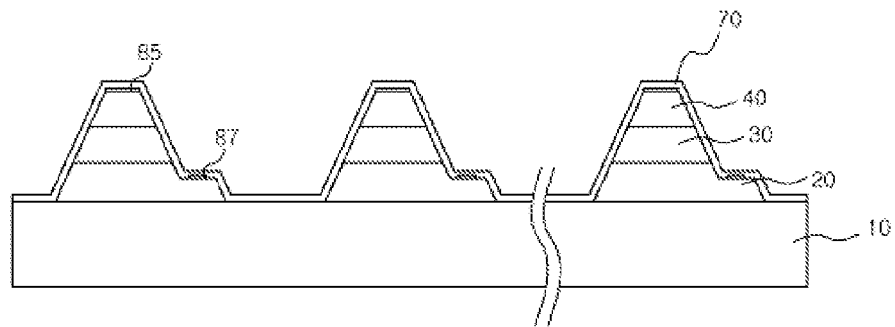

Referring to FIG. 15, a continuous insulation layer 70 is formed on an entire surface of the substrate 10 with the plurality of light emitting cells formed thereon. The insulation layer 70 covers the side surfaces and top surfaces of the light emitting cells and the top surfaces of the substrate 10 between the adjacent light emitting cells. For example, the insulation layer 70 may be formed as a silicone oxide film using a CVD (Chemical Vapor Deposition) technique.

Since the side surfaces of the light emitting cells are inclined, the insulation layer 70 can easily cover the side surfaces of the light emitting cells. Since the total thickness of the N-type semiconductor layer 20 and active layer 30 is small and spaces between the adjacent P-type semiconductor layers 40 are broad, the side surfaces of the P-type semiconductor layers 40 adjacent to the exposed regions of the N-type semiconductor layers 20 can be easily covered with the insulation layer 70.

Figure 16:
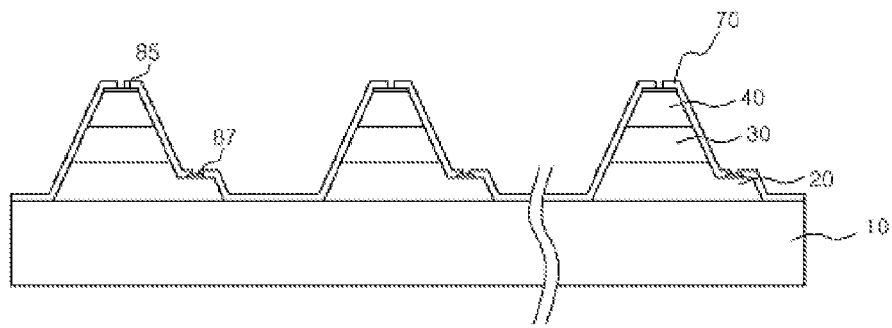

Referring to FIG. 16, an opening portion is formed on each of the exposed N-type and P-type semiconductor layers 20 and 40 of the light emitting cell by patterning the insulation layer 70 through a predetermined etching process. If the transparent electrode layer 85 and/or the ohmic metal layer 87 are formed as shown in this figure, the transparent electrode layer 85 and/or the ohmic metal layer 87 are exposed through the opening portion.

Figure 17:
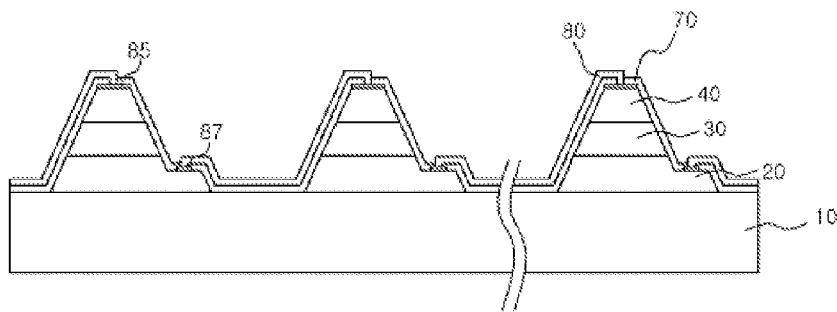

Referring to FIG. 17, a wire 80 is formed on the insulation layer 70 with the opening portion. The wire 80 connects the N-type and P-type semiconductor layers 20 and 40 through the opening portion thereof. That is, the N-type semiconductor layer 20 of one light emitting cell and the P-type semiconductor layer 40 of another adjacent the light emitting cell are electrically connected with the wire.

The wire 80 may be formed using a plating technique. That is, after an etching mask pattern with an opening portion defining a region of the wire 80 has been formed on the insulation layer 70 and a metal layer has been plated within the opening portion, the etching mask pattern is removed and thus the wire 80 can be formed.

Further, the wire 80 may be formed using the CVD (Chemical Vapor Deposition) or PVD (Physical Vapor Deposition) technique. That is, a metal layer is formed using a vapor deposition technique such as electron beam deposition and then patterned using a photo and etching process, so that the wire 80 can be formed. Since the side surface of the light emitting cell is inclined, the metal layer is continuously formed on the upper side surface of the light emitting cell.

The light emitting device in which the wire 80 is formed as described above has an advantage in that it is possible to prevent the wire 80 from being disconnected or shorted due to external pressure and also prevent conductive materials such as metal, which remains while the wire 80 is formed, from shorting the light emitting cell.

Accordingly, a light emitting device in which the plurality of light emitting cells each of which side surfaces of the P-type semiconductor layer 40, the active layer 30 and the N-type semiconductor layer 20 are not perpendicular (90°) to but inclined at predetermined slope is from a horizontal plane are connected with one another can be manufactured.

As described above, the light emitting device according to the present invention is formed such that the side surfaces of the P-type semiconductor layer, the active layer and a portion of the N-type semiconductor layer are not perpendicular (90°) to but inclined at a predetermined slope from a horizontal plane. Therefore, luminous efficiency of the light emitting device of the present invention can be enhanced as compared with that of the conventional light emitting device. The reason is that a photon reflected on a flat surface in the prior art is not reflected on a surface with a different angle but emitted to the outside.

Figure 18:
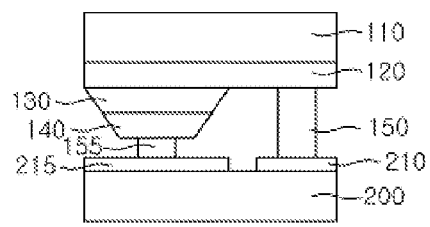
FIG. 18 is a conceptual sectional view illustrating a light emitting device with a flip chip structure according to the present invention.

FIG. 18 is a conceptual sectional view illustrating a light emitting device with a flip chip structure according to the present invention.

Referring to FIG. 18, the light emitting device comprises a light emitting layer, i.e. an N-type semiconductor layer 120, an active layer 130 and a P-type semiconductor layer 140 sequentially formed on a base substrate 110. Further, the light emitting device comprises a submount substrate 200 onto which the base substrate 110 with the light emitting layer formed thereon is flip-chip bonded through metal bumps 150 and 155. A side surface of the light emitting layer comprising the P-type semiconductor layer 140, the active layer 130 and the N-type semiconductor layer 120 is inclined at a slope of 20 to 80° from the horizontal plane and a critical angle of light is changed due to the side surface such that the light can be easily extracted. Therefore, luminous efficiency of the light emitting device can be improved.

FIGS. 19 to 23 are sectional views illustrating a process of manufacturing a light emitting device according to a fifth embodiment of the present invention.

Figure 19:
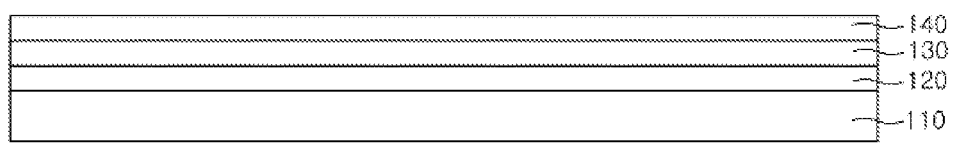
FIGS. 19 to 23 are sectional views illustrating a process of manufacturing a light emitting device according to a fifth embodiment of the present invention.

Referring to FIG. 19, an N-type semiconductor layer 120, an active layer 130 and a P-type semiconductor layer 140 are sequentially formed on a base substrate 110.

The base substrate 110 refers to a general wafer used for fabricating a light emitting device is made of a transparent substrate such as $Al_2O_3$, ZnO and $LiAl_2O_3$. In this embodiment, a crystal growth substrate made of sapphire is used.

The N-type semiconductor layer 120, the active layer 130 and the P-type semiconductor layer 140 are sequentially formed on the substrate 110 through various deposition methods including MOCVD (Metal Organic Chemical Vapor Deposition), CVD (Chemical Vapor Deposition), PCVD (Plasma-enhanced Chemical Vapor Deposition), MBE (Molecular Beam Epitaxy), HVPE (Hybride Vapor Phase Epitaxy) and the like. A buffer layer may be further formed on the substrate 110 to reduce lattice mismatch between the substrate 110 and the subsequent layers upon growth of crystals. The aforementioned components are the same as those in the previous embodiments, and thus, descriptions overlapping with the foregoing components will be omitted herein.

Thereafter, portions of the P-type semiconductor layer 140 and the active layer 130 are removed through a predetermined etching process to expose a portion of the N-type semiconductor layer 120. This etching process is the same as that of the previous embodiments.

Figure 20:
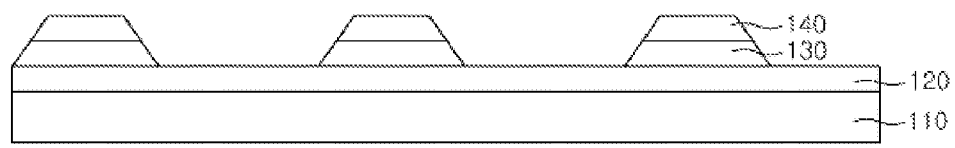

That is, after a photoresist has been applied at a thickness of 3 to 50 μm on the P-type semiconductor layer 140 of FIG. 19 and light-exposed, it is immediately developed without hard-baking to form an etching mask pattern. The P-type semiconductor 140 and the active layer 130, which are exposed through the etching mask pattern, are removed through an ICP (Inductive Coupled Plasma) or dry etching process to expose the N-type semiconductor layer 120. Thereafter, if the etching mask pattern is removed, side surfaces of the P-type semiconductor layer 140 and the active layer 130 which are not perpendicular (90°) to but inclined at a predetermined slope from the horizontal plane can be obtained as shown in FIG. 20.

Alternatively, after a photoresist has been applied at a thickness of 3 to 50 μm on the P-type semiconductor layer 140 of FIG. 19 and light-exposed, it is hard-baked at a temperature of 100 to 140° C. and then developed such that an etching mask pattern can be formed. After the P-type semiconductor layer 140 and the active layer 130, which are exposed through the etching mask pattern, have been etched, the etching mask pattern is removed such that the side surfaces of the etched P-type semiconductor layer 140 and active layer 130 can have a variety of slopes of 80 to 20°.

A reflection layer for reflecting light may be further formed on a top surface of the P-type semiconductor layer 140, and an additional ohmic metal layer for facilitating the supply of current may be further formed on a top surface of the P-type semiconductor layer 140 or the exposed N-type semiconductor layer 120. The ohmic metal layer may be made of Cr or Au.

Figure 21:
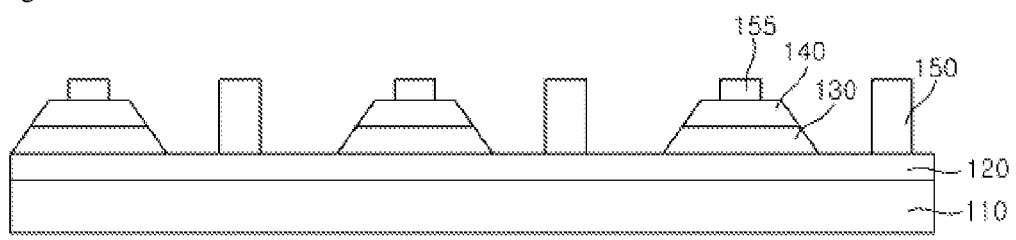

Further, P-type and N-type metal bumps 155 and 150 are formed on the P-type and N-type semiconductor layers 140 and 120, respectively, as shown in FIG. 21. Each of the P-type and N-type metal bumps 155 and 150 may be made of at least one material selected from the group consisting of Pb, Sn, Au, Ge, Cu, Bi, Cd, Zn, Ag, Ni, Ti and an alloy thereof. To this end, a photoresist is applied onto an entire structure and a photoresist pattern (not shown) through which portions of the P-type and N-type semiconductor layers 140 and 120 are exposed is formed through a photo-etching process using a predetermined mask. After a metal film has been deposited on the entire structure, metal film portions formed on regions other than regions on the P-type and N-type semiconductor layers 140 exposed through the photoresist pattern and the photoresist pattern are removed. Accordingly, the P-type and N-type metal bumps 155 and 150 are formed on the P-type and N-type semiconductor layers 140 and 120, respectively.

Figure 22:
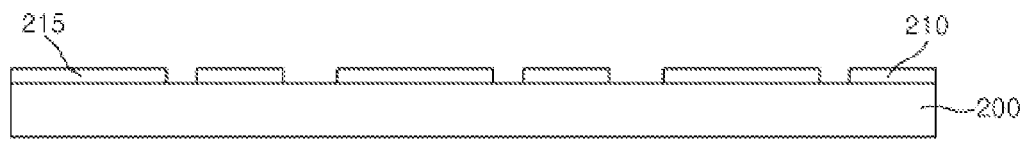

Next, referring to FIG. 22, an additional submount substrate 200 is prepared to form P-type and N-type bonding pads 215 and 210 connected to the P-type and N-type metal bumps 155 and 150, respectively.

At this time, various kinds of superior heat conductive substrates 200 are used as the submount substrate 200. That is, the submount substrate 200 may be made of SiC, Si, Ge, SiGe, AlN, metal or the like. In this embodiment, AlN with superior heat conductivity and insulation property is used. The present invention is not limited thereto, but a metallic material with superior heat and electric conductivity may be employed. In this case, an insulation or dielectric film is formed on the substrate 200 to sufficiently serve as an insulation. The dielectric film may be made of SiO2, MgO and SiN or an insulating material. Further, each of the P-type and N-type bonding pads 210 and 215 is made of a metal with superior electric conductivity. This is formed through a screen printing process or a deposition process using a predetermined mask pattern.

Thereafter, the submount substrate 200 is flip-chip bonded onto the base substrate 110 with the light emitting layer formed thereon.

Figure 23:
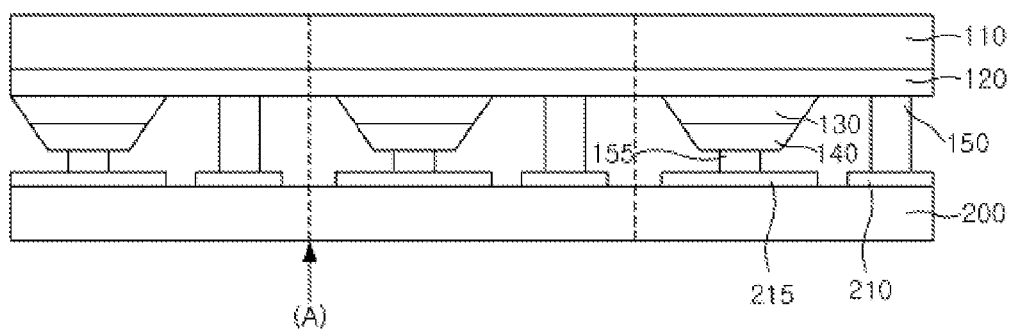

Referring to FIG. 23, in the light emitting device of the present invention, the N-type and P-type metal bumps 150 and 155 formed on the top of the light emitting layer are bonded and connected with the N-type and P-type bonding pads 210 and 215 of the submount substrate 200, respectively. At this time, the bonding pads and metal bumps may be bonded using heat or ultrasonic waves or simultaneously using the heat and ultrasonic waves. The metal bumps 150 and 155 and the lower bonding pads 210 and 215 are connected through a variety of bonding methods.

Moreover, the N-type and P-type metal bumps 150 and 155 are not formed on the is top of the light emitting layer but may be formed on the submount substrate 200.

As can be seen from this figure, a plurality of light emitting devices may be fabricated on a single substrate 10, which is cut into the individual light emitting devices. At this time, portions A shown in FIG. 23 are cutting portions used for individually cutting the plurality of light emitting devices.

The aforementioned process of manufacturing a light emitting device according to the present invention is merely a specific embodiment, but is not limited thereto. Various processes and manufacturing methods may be modified or added depending on the characteristics of devices and the convenience of processes. For example, in the same process as the previous embodiments, the base substrate with the N-type semiconductor layer, the active layer and the P-type semiconductor layer sequentially formed thereon is prepared as shown in FIG. 19. Then, portions of the P-type semiconductor layer, the active layer and the N-type semiconductor layer are first removed to expose the substrate such that the plurality of light emitting devices can be individually isolated. At this time, the side surfaces of the P-type semiconductor layer, the active layer and the N-type semiconductor layer, which are etched through the aforementioned process, may be formed not to be perpendicular (90°) to but inclined at a predetermined slope.

Accordingly, a light emitting device with a flip chip structure, in which the side surfaces of the P-type semiconductor layer, the active layer and a portion of the N-type semiconductor layer are not perpendicular (90°) to but inclined at the predetermined slope from the horizontal plane, can be manufactured.

FIGS. 24 to 28 are sectional views illustrating a process of manufacturing a light emitting device according to a sixth embodiment of the present invention.

The sixth embodiment is almost the same as the fifth embodiment. In the sixth embodiment, however, there is provided a light emitting device with a flip chip structure, in which a plurality of light emitting cells are connected in series, parallel or series-parallel in a wafer level to reduce the size of the device, and they can be driven at proper voltage and current to be used for illumination purpose and can also be driven even with an AC power source. Descriptions overlapping with the previous embodiments will be omitted herein.

Figure 24:
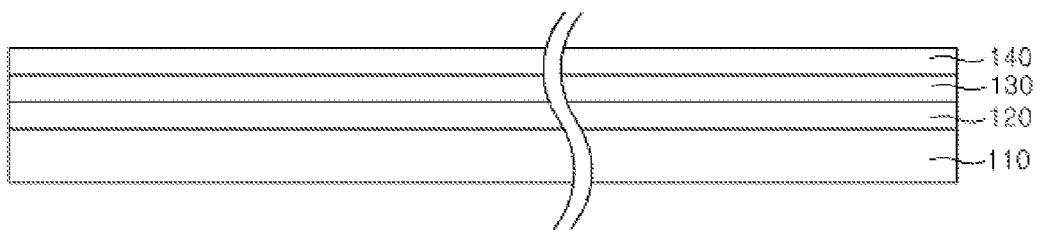
FIGS. 24 to 28 are sectional views illustrating a process of manufacturing a light emitting device according to a sixth embodiment of the present invention.

Referring to FIG. 24, an N-type semiconductor layer 120, an active layer 130 and a P-type semiconductor layer 140 are sequentially formed on a base substrate 110 through various deposition methods including MOCVD (Metal Organic Chemical Vapor Deposition), CVD (Chemical Vapor Deposition), PCVD (Plasma-enhanced Chemical Vapor Deposition), MBE (Molecular Beam Epitaxy), HVPE (Hybrid Vapor Phase Epitaxy) and the like. A buffer layer may be further formed on the substrate 110 to reduce lattice mismatch between the substrate 110 and the subsequent layers upon growth of crystals.

Figure 25:
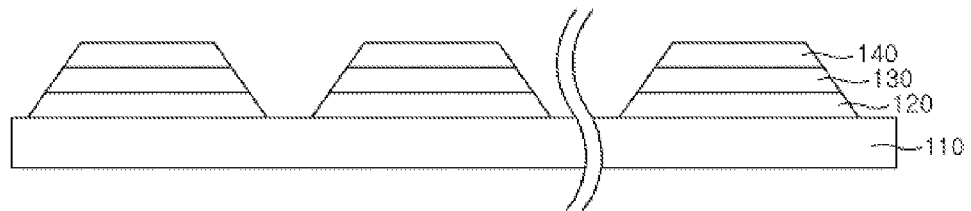

Thereafter, portions of the N-type semiconductor layer 120, the active layer 130 and the P-type semiconductor layer 140, which are sequentially formed on the base substrate 110, are removed to form a plurality of light emitting cells. To this end, after a photoresist has been applied at a thickness of 3 to 50 μm on the P-type semiconductor layer 140 of FIG. 24 and light-exposed, it is immediately developed without hard-baking to form an etching mask pattern. The P-type semiconductor 140, the active layer 130 and the predetermined N-type semiconductor layer 120, which are exposed through the etching mask pattern, are removed through an ICP (Inductive Coupled Plasma) or dry etching process to separate the light emitting cells from one another. Next, if the etching mask pattern is removed, a light emitting device in which entire side surfaces of the etched P-type semiconductor layer 140, active layer 130 and N-type semiconductor layer 120 are not perpendicular (90°) to but inclined at a predetermined slope from the horizontal plane can be obtained as shown in FIG. 25.

Alternatively, after a photoresist has been applied at a thickness of 3 to 50 μm on the P-type semiconductor layer 140 of FIG. 24 and light-exposed, it is hard-baked at a temperature of 100 to 140° C. and developed such that an etching mask pattern can be formed. After the P-type semiconductor layer 140, the active layer 130 and the N-type semiconductor layer 120, which are exposed through the etching mask pattern, have been etched, the etching mask pattern is removed such that the side surfaces of the etched P-type semiconductor layer 140 and active layer 130 can be inclined at various slopes of 80 to 20°.

Figure 26:
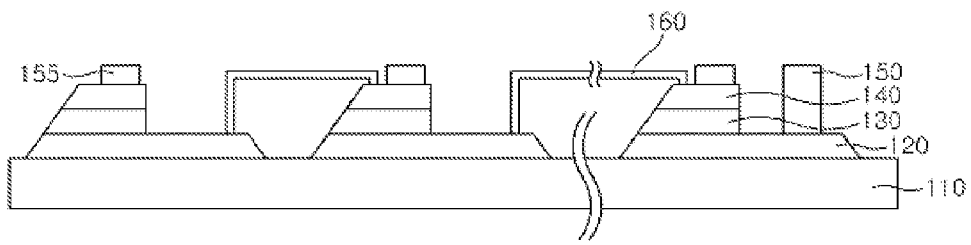

Next, portions of the P-type semiconductor layer 140 and the active layer 130 are removed through a predetermined etching process to expose a portion of the N-type semiconductor layer 120, as shown in FIG. 26. The exposed N-type semiconductor layer 120 of one light emitting cell and the P-type semiconductor layer 140 of another adjacent light emitting cell are connected with each other through a predetermined conductive wire. At this time, a bridge wire 160 is made of a conductive material, e.g. metal. It will be apparent that the bridge wire 160 may be made of a silicone compound doped with impurities. The bridge wire 160 is formed through a bridge process.

Further, a plurality of metal bumps are formed on the top of the light emitting cells, and P-type and N-type metal bumps 155 and 150 are further formed on the P-type semiconductor layer 140 of the light emitting cell positioned at one edge of the substrate 110 and the N-type semiconductor layer 120 of the light emitting cell positioned the other edge of the substrate, respectively.

Figure 27:
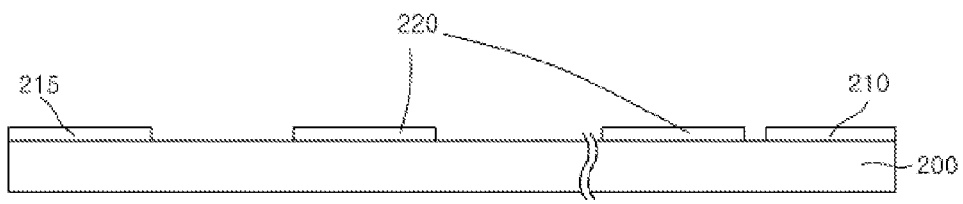

Next, as shown in FIG. 27, an additional submount substrate 200 is prepared, on is which a plurality of bonding layers 220, a P-type bonding pad 215 positioned at one edge of the submount substrate 200 and an N-type bonding pad 210 positioned at the other edge of the submount substrate are formed.

Figure 28:
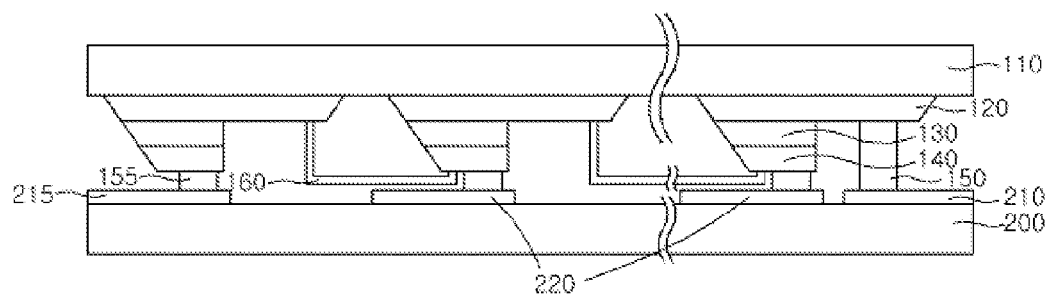

Thereafter, as can be shown in FIG. 28, the aforementioned base substrate 110 with the plurality of light emitting cells formed thereon is flip-chip bonded onto the submount substrate 200 to fabricate the light emitting device. The substrates are bonded with each other through the metal bumps 150 and 155 formed on the top of the light emitting cell and the bonding layers 220 formed on the submount substrate 200, respectively. The P-type bonding pad 215 positioned at one edge of the submount substrate 200 is connected to the P-type metal bump 155 of the light emitting cell positioned at one edge of the base substrate 110, whereas the N-type bonding pad 210 positioned at the other edge of the submount substrate 200 is connected to the N-type metal bump 150 of the light emitting cell positioned at the other edge of the base substrate 110.

The aforementioned process of manufacturing a light emitting device according to the present invention is merely a specific embodiment, but is not limited thereto. Various processes and manufacturing methods may be modified or added depending on the characteristics of devices and the convenience of processes. For example, in this embodiment, the conductive wire for electrically connecting the N-type semiconductor layer of one light emitting cell and the P-type semiconductor layer of another adjacent light emitting cell is formed through a bridge process, and the base substrate is then flip-chip bonded onto the submount substrate. However, the present invention is not limited thereto. That is, a conductive wire for electrically connecting the N-type semiconductor layer of one light emitting cell and the P-type semiconductor layer of another adjacent light emitting cells may be formed through a step is coverage process which is the same as in the fourth embodiment. Further, an electrode layer may be formed on the submount substrate when the plurality of light emitting cells are flip-chip bonded onto the submount substrate such that the N-type semiconductor layer of one light emitting cell and the P-type semiconductor layer of another adjacent light emitting cell are electrically connected through the metal bumps.

Accordingly, a light emitting device in which a plurality of flip chip light emitting cells each having a side surface of a light emitting layer, which is not perpendicular (90°) to but inclined at a predetermined slope from the horizontal plane, are arrayed on the submount substrate can be manufactured. The light emitting cells may be connected in various ways, i.e. in series, parallel or series-parallel, depending on the desired purpose.

Figure 29:
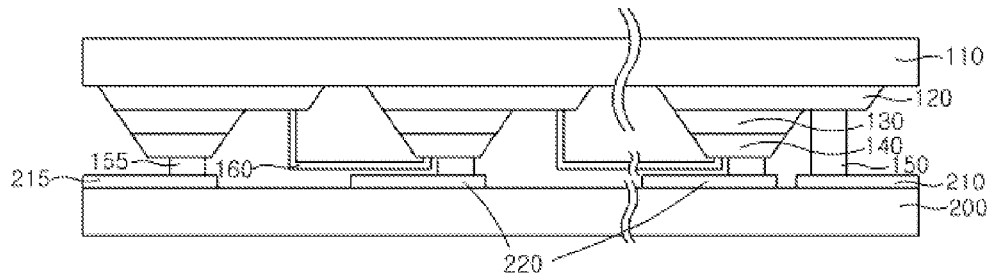
FIG. 29 is a sectional view showing a seventh embodiment according to the present invention.

FIG. 29 is a sectional view showing a seventh embodiment according to the present invention.

The seventh embodiment is almost the same as the sixth embodiment. In this embodiment, even in a case where a plurality of light emitting cells are separated by etching such that the side surfaces may have slopes as shown in FIG. 25 and then etched to expose an N-type semiconductor layer, a light emitting device can be manufactured using the same etching process as the previous embodiment. That is, side surfaces of a P-type semiconductor layer 140 and an active layer 130 etched to expose an N-type semiconductor layer 120 are formed with various slopes, as shown in FIG. 29.

Accordingly, a light emitting device in which a plurality of flip chip light emitting cells each having an entire side surface of a light emitting layer, which is not perpendicular (90°) to but inclined at a predetermined slope from the horizontal plane, are arrayed on the submount substrate can be manufactured. The light emitting cells may be connected in various ways, i.e. is in series, parallel or series-parallel, depending on the desired purpose.

As described above, the light emitting device with a flip chip structure according to the present invention is formed such that some side surfaces of a light emitting layer are not perpendicular (90°) to but inclined at a predetermined slope from the horizontal plane. Therefore, luminous efficiency of the light emitting device of the present invention can be enhanced as compared with that of the conventional light emitting device. The reason is that a photon reflected on a flat surface in the prior art is not reflected on a surface with a different angle but emitted to the outside.

Figure 30:
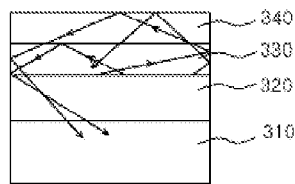
FIGS. 30 and 31 are conceptual sectional views illustrating a difference between effects of the light emitting devices according to the prior art and the present invention.
Figure 31:
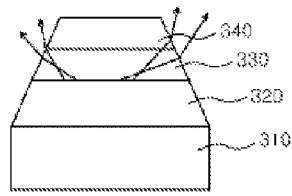

FIGS. 30 and 31 are conceptual sectional views illustrating a difference between effects of the light emitting devices according to the prior art and the present invention.

The light efficiency of a light emitting device may be expressed as internal quantum efficiency and external quantum efficiency, and the internal quantum efficiency is determined in accordance with the design and quality of an active layer. The external quantum efficiency is determined in accordance with a degree where a photon produced in an active layer is emitted to the outside of a light emitting device. Referring to FIG. 30 in which a conventional light emitting device is shown, a side surface of a semiconductor layer is formed perpendicular to a horizontal plane. In such a case, some portions of photons are not penetrated through the side surface of the semiconductor layer but reflected thereon, and totally reflected light is not emitted to the outside but dissipated within the light emitting device. However, referring to FIG. 31 in which a light emitting device according to the present invention is shown, a side surface of a semiconductor layer is not perpendicular to but inclined at a predetermined slope from a horizontal plane. In such a case, the inclined side surface makes a critical angle of light change to help the light to be more easily extracted. Therefore, light generated in an active layer is not is totally reflected but emitted to the outside of the light emitting device such that external quantum efficiency can be markedly enhanced.

Figure 32:
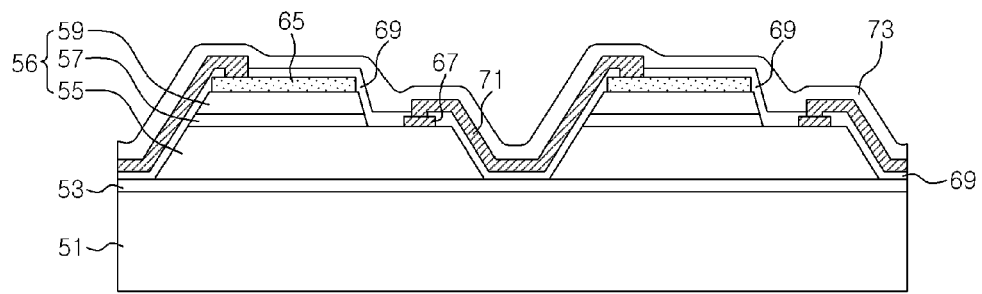
FIG. 32 is a sectional view illustrating a light emitting diode for AC operation according to an eighth embodiment of the present invention.

FIG. 32 is a sectional view illustrating a light emitting diode for AC operation according to the eighth embodiment of the present invention.

Referring to FIG. 32, a plurality of light emitting cells 56 are disposed to be spaced apart in a substrate 51. The substrate 51 may be insulating or conducting one, and may be, for example, a sapphire or a silicon carbide (SiC) substrate.

The light emitting cells 56 respectively include a lower semiconductor layer 55, an upper semiconductor layer 59 disposed in a region of the lower semiconductor layer, and an active layer 57 disposed between the lower semiconductor layer and the upper semiconductor layer. The upper and the lower semiconductor layers may be N-type and P-type, respectively. Alternatively the upper and the lower semiconductor layers may be P-type and N-type, respectively.

The lower semiconductor layer 55, active layer 57 and upper semiconductor layer 59 may include a gallium nitride-based semiconducting material, for example, (B, Al, In, Ga)N. Elements and stoichiometry of the active layer 57 may be determined so that a light having a desired wavelength, for example, ultraviolet ray or blue light, can be emitted. The lower semiconductor layer 55 and upper semiconductor layer 59 are formed of a material having a greater bandgap compared with the active layer 57.

The lower semiconductor layer 55 and/or the upper semiconductor layer 59 may be, as illustrated, formed of a single layer or multiple layers. The active layer 57 may have a single-quantum-well structure or a multiple-quantum-well structure.

A buffer layer 53 may be disposed between the light emitting cells 56 and the is substrate 51. The buffer layer 53 is employed to reduce a lattice mismatch between the substrate 51 and the lower semiconductor layer 55 formed thereon. The buffer layer 53 may be continuous as illustrated, but it is not limited thereto. The buffer layer 53 may be disposed under the lower semiconductor layers 55 to be discontinuous.

Side surfaces of the light emitting cells 56 are formed to be inclined with respect to an upper surface of the substrate 51 and get narrowed toward upside. The inclination of the side surfaces improves emission efficiency of a light produced in the active layer 57, and helps conformal deposition of other layers which will be formed on the light emitting cells 56. In the exemplary embodiment, the inclinations of the side surfaces of the respective lower semiconductor layers 55 of the light emitting cells 56 may be in a range of approximately 15 degrees to approximately 80 degrees.

An insulation layer 69 covers an entire surface of the light emitting cells 56. The insulation layer 69 include opening portions on other regions of the lower semiconductor layers 55, for example, a region adjacent to a region on which the upper semiconductor layer 59 is formed, and include opening portions on the upper semiconductor layers 59. The opening portions are space apart from each other, and therefore, the side surfaces of the light emitting cells 56 are covered with the insulation layer 69. The insulation layer 69 may cover the substrate 51 in regions between the light emitting cells 56, or the buffer layer 53. The insulation layer 69 may include a silicon oxide (SiO2) layer.

Wires 71 are formed on the insulation layer 69. The wires 71 are electrically connected to the lower semiconductor layers 55 and the upper semiconductor layers 59 through the opening portions. In addition, the wires 71 respectively connect the lower semiconductor layers 55 and the upper semiconductor layers 59 of the adjacent light emitting cells 56 to form a is series array of the light emitting cells 56. The array may be formed in plurality, and a plurality of arrays may be connected to be reverse parallel and connected to AC power to be driven. Further, a bridge rectifier (not shown) connected to the series array of the light emitting cells may be formed, and the light emitting cells may be driven with AC power by the bridge rectifier. The bridge rectifier may be formed by connecting light emitting cells having substantially the same structure as the light emitting cells using wires 71. The wires may be formed of a conductive material, for example, a doped semiconducting material such as polycrystalline silicon or a metal.

Meanwhile, electrode pads may be disposed between other regions of the lower semiconductors 55 and the insulation layer 69. The electrode pads 67 are exposed by the opening portions formed in other regions of the lower semiconductor layers 55. The electrode pads 67 have ohmic contacts to the lower semiconductor layers 55. The wires 71 are in contact with the electrode pads 67 exposed by the opening portions to be electrically connected to the lower semiconductor layers 55.

Transparent electrode layers 65 may be disposed between the upper semiconductor layers 59 and the insulation layers 69. The transparent electrode layers 65 are exposed by the opening portions formed on the upper semiconductor layers 59. The transparent electrode layers 65 transmit light produced in the active layer 57, and disperse and supply currents to the upper semiconductor layers 59. The wires 71 are in contact with the transparent electrode layers 65 exposed by the opening portions to be electrically connected to the upper semiconductor layers 59. Electrode pads (not shown) may be further formed on the transparent electrode layers 65 and the wires 71 may be in contact with the electrode pads.

A protecting insulation layer 73 may cover the wires 71 and the insulation layer 69. The protecting insulation layer 73 substantially reduces contamination of the wires 71 from moisture and so forth, and damage of the wires 71 from external pressure. The protecting insulation layer 73 may be formed of a light-transmitting material, for example, silicon oxide layer.

FIGS. 33 to 38 are sectional views illustrating a process of manufacturing a light emitting diode according to the eighth embodiment of the present invention.

Figure 33:
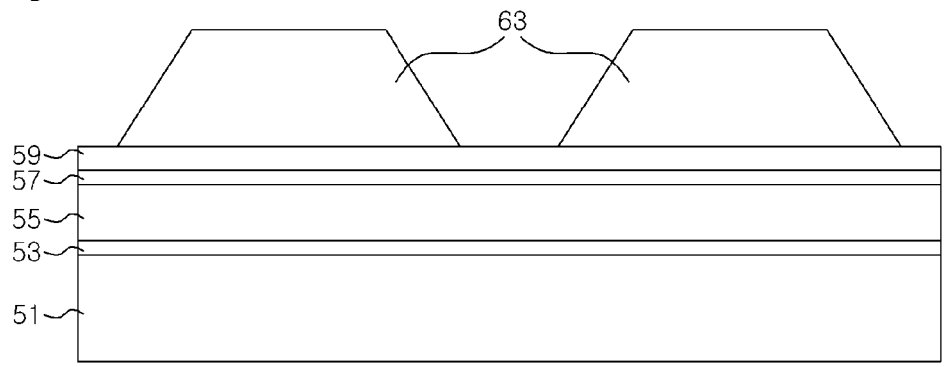
FIGS. 33 to 38 are sectional views illustrating a process of manufacturing a light emitting diode according to the eighth embodiment of the present invention.

Referring to FIG. 33, a lower semiconductor layer 55, an active layer 57, and an upper semiconductor layer 59 are formed on a substrate 51. A buffer layer 53 may be formed on the substrate 51 before the lower semiconductor layer 55 is formed.

The substrate 51 may be sapphire (Al2O3), silicon carbide (SiC), zinc oxide (ZnO), silicon (Si), gallium arsenide (GaAs), gallium phosphate (GaP), lithium-alumina (LiAl2O3), boron nitride (BN), aluminum nitride (AlN) or gallium nitride (GaN). However, it is not limited thereto and may be variable according to a semiconducting material which is to be formed on the substrate 51.

The buffer layer 53 is formed to reduce lattice mismatch between the substrate 51 and the semiconductor layer 55 which is to be formed thereon. The buffer layer 53 may include, for example, gallium nitride (GaN) or aluminum nitride (AlN). When the substrate 51 is a conductive substrate, the buffer layer 53 may be formed of an insulation layer or a semi-insulation layer, for example, AlN or semi-insulating GaN.

The lower semiconductor layer 55, active layer 57 and upper semiconductor layer 59 may include a gallium nitride-based semiconducting material, for example, (B, Al, In, Ga)N. The lower and upper semiconductor layers 55 and 59 and the active layer 57 may be formed continuously or discontinuously using, for example, metal organic chemical vapor deposition (MOCVD), molecular beam epitaxy or hydride vapor phase epitaxy (HNPE) technology.

The upper and the lower semiconductor layers may be N-type and P-type, respectively. Alternatively the upper and the lower semiconductor layers may be P-type and N-type, respectively. In the gallium nitride-based compound semiconductor layer, N-type semiconductor layer may be doped with, for example, silicon (Si), and P-type semiconductor layer may be doped with, for example, magnesium (Mg).

Photoresist patterns 63 defining light emitting cell regions are formed on the upper semiconductor layer 59. The photoresist patterns are formed to cover the light emitting cell regions. Reflow of the photoresist patterns 63 is performed so that side surfaces can be inclined with respect to an upper surface of the substrate 51. The side surfaces of the photoresist patterns 63 may be formed to have an inclination angle in a range of approximately 15 degrees to 80 degrees with respect to the upper surface of the substrate 51.

Figure 34:
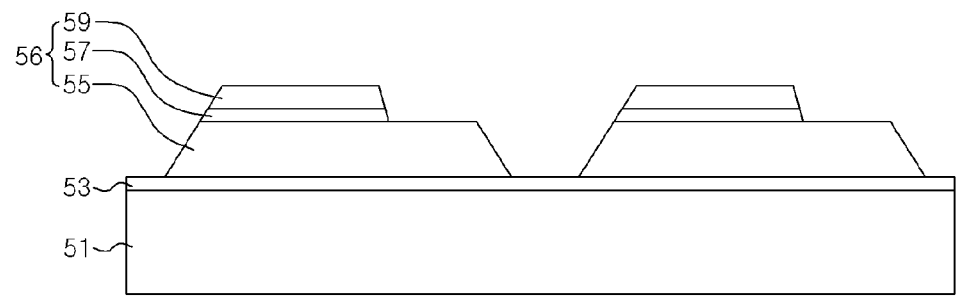

Referring to FIG. 34, the upper semiconductor layer 59, the active layer 57 and the lower semiconductor layer 55 are sequentially etched using the photoresist patterns 63 as etching mask. Accordingly, the shape of the photoresist patterns 63 is reproduced in the semiconductor layers 59, 57 and 55 and the light emitting cells with inclined side surfaces are separated. The buffer layer 53 may be exposed and the exposed buffer layer 53 may be removed by over-etching.

Thereafter, the photoresist patterns 63 are removed, and the upper semiconductor layer and the active layer are patterned again to expose the etched lower semiconductor layers 55. The exposed lower semiconductor layers may be partially etched by over-etching. Accordingly, light emitting cells 56 that are spaced apart are formed on the substrate 51. Each of the light emitting cells 56 includes the lower semiconductor layer 55 which is spaced apart by etching, the upper semiconductor layer 59 disposed on an upper side of a region of the lower semiconductor layer 55, and the active layer 57 disposed between the lower semiconductor layer 55 and the upper semiconductor layer 59. Other region of the lower semiconductor layer 55 is exposed. Further, most of the side surfaces of the light emitting cells 56 are formed to be inclined with respect to an upper surface of the substrate 51. Whereas, side surfaces of the upper semiconductor layers 59 adjacent to other regions of the lower semiconductor layers 55 may be formed to be inclined as illustrated, and alternatively, may be formed vertically.

Figure 35:
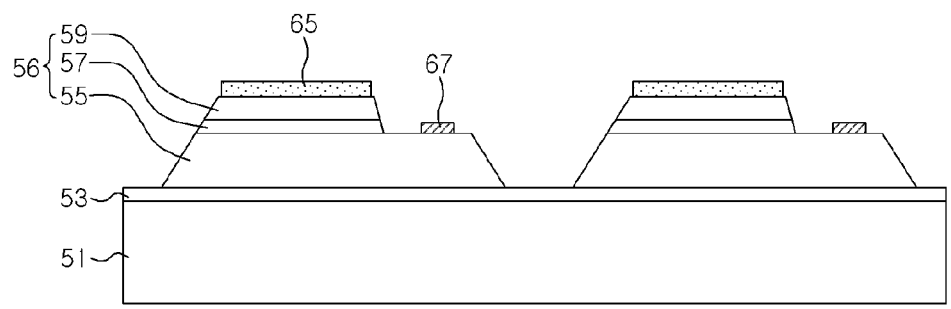
Figure 36:
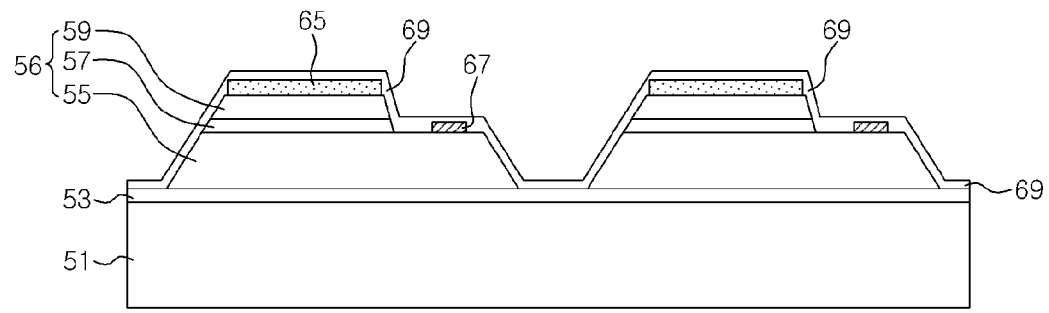

Referring to FIG. 35, a transparent electrode layer 65 may be formed on the upper semiconductor layer 59 of the light emitting cell 56. The transparent electrode layer 65 includes a transparent metal such as indium tin oxide (ITO) layer or Ni/Au. Further, electrode pads 67 may be formed on other regions of the lower semiconductor layers 55. The electrode pads 67 have an ohmic contact with the lower semiconductor layers 55.

The transparent electrode layer 65 may be formed on the upper semiconductor layer 59 before the photoresist patterns are formed. The transparent electrode layer 65 is patterned together with the upper semiconductor layer Referring to FIG. 36, a continuous insulation layer 69 is formed on an entire surface of the substrate 51 with the plurality of light emitting cells 56 formed thereon. The insulation layer 69 covers the side surfaces and top surfaces of the light emitting cells 56, and the top surfaces of the substrate 51 between the adjacent light emitting cells 56. For example, the insulation layer 69 may be formed as a silicone oxide film using a CVD (Chemical Vapor Deposition) technique.

Since the side surfaces of the light emitting cells 56 are inclined, the insulation layer 69 can easily cover the side surfaces of the light emitting cells 56. Since the total is thickness of the upper semiconductor layer 59 and active layer 57 is small and spaces between the upper semiconductor layers 59 are broad, the side surfaces of the upper semiconductor layers 59 adjacent to other regions of the lower semiconductor layers 55 can be easily covered with the insulation layer 69.

Figure 37:
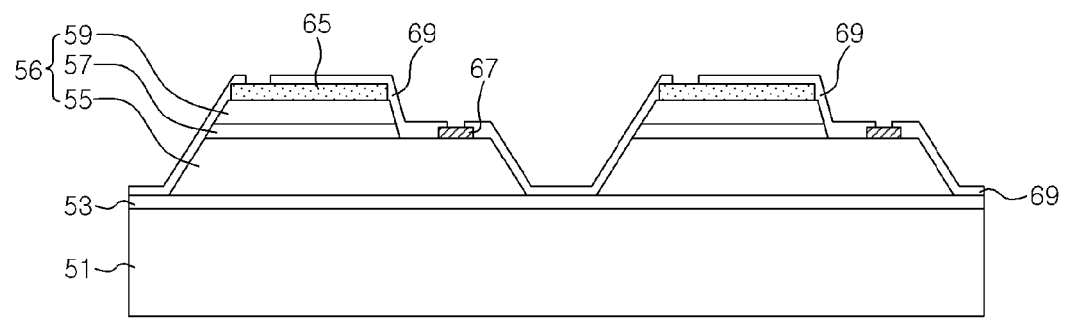

Referring to FIG. 37, an opening portions are formed on other regions of the lower semiconductor layers 55 and the upper semiconductor layers 59 by patterning the insulation layer 69. If the electrode pads 67 and the transparent electrode layers 65 are formed, the electrode pads 67 and the transparent electrode layers 65 are exposed through the opening portions.

The opening portions may be formed using a photo and etching process, and the electrode pads 67 substantially reduce damage of the lower semiconductor layers 55 while the insulation layer 69 is etched.

Figure 38:
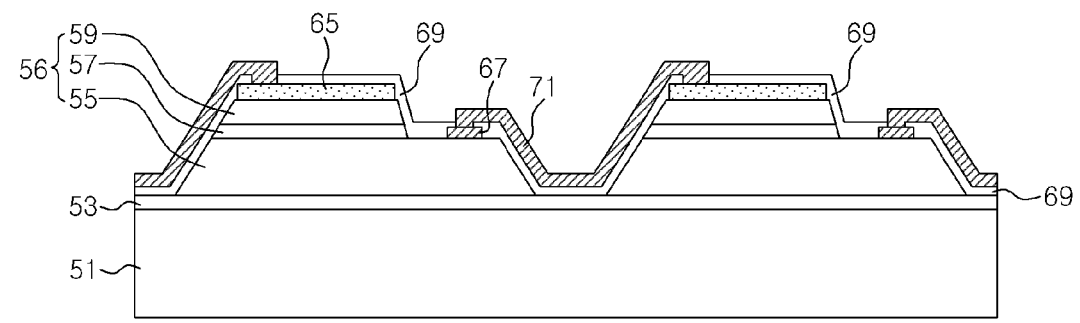

Referring to FIG. 38, wires 71 are formed on the insulation layer 69 with the opening portions. The wire 71 are electrically connected to the lower semiconductor layers 55 and the upper semiconductor layers 59 through the opening portions, and connect the lower semiconductor layers 55 and the upper semiconductor layers 59 of the adjacent light emitting cells 56 to form arrays connected in series.

The wires 71 may be formed using a plating technique. That is, the wires 71 may be formed by forming a photoresist pattern having opening portions defining wire region on the insulation layer 69, plating a metal layer in the opening portions, and removing the photoresist pattern.

Alternatively, the wires 71 may be formed using CVD (Chemical Vapor Deposition) or PVD (Physical Vapor Deposition) technique. That is, a metal layer is formed using a vapor deposition technique such as electron beam deposition and then patterned using a is photo and etching process, so that the wires 71 can be formed. Since the insulation layer 69 covers the side surfaces of the light emitting cells 56, short-circuiting of the light emitting cells 56 due to a remaining metallic material after patterning of metal layer may be prevented.

A protecting insulation layer 73 is formed on the substrate 51 with the wires 71 formed thereon. The protecting insulation layer 73 is formed of a light-transmitting material, for example, silicon oxide layer using chemical vapor deposition technique. In this way, a light emitting diode for AC operation.

According to the eighth embodiment, a reliable light emitting diode for AC operation can be provided by preventing disconnection or short circuit of wires by external pressure, and short circuit of a light emitting cell by a conductive material such as metal residue while the wires are formed may be prevented. Further, the wires may be formed to be supported by insulation layers, so that a reliable light emitting diode for AC operation can be manufactured.

Although the present invention has been described in detail in connection with the specific embodiments, it will be readily understood by those skilled in the art that various modifications and changes can be made thereto within the technical spirit and scope of the present invention. It is also apparent that the modifications and changes fall within the scope of the present invention defined by the appended claims.

What is claimed is:

1. A light emitting device, comprising:
a plurality of light emitting cell each comprising an N-type semiconductor layer, a P-type semiconductor layer disposed on the N-type semiconductor layer and an active layer interposed between the N-type semiconductor layer and the P-type semiconductor layer, wherein the active layer and the P-type semiconductor layer cover a portion of a top surface of the N-type semiconductor layer, such that the top surface of the N-type semiconductor layer is partially exposed;
a first insulation layer covering the plurality of light emitting cells, and comprising openings which expose at least partial top surfaces of the N-type semiconductor layer and the P-type semiconductor layer;
an ohmic contact layer contacting the N-type semiconductor layer through the opening, and
a second insulation layer covering the ohmic contact layer and the first insulation layer,
wherein the ohmic contact layer at least partially covers the first insulation layer,
wherein the second insulation layer has a substantially constant thickness with respect to surfaces of the plurality of light emitting cells, and
wherein side surface of the P-type semiconductor layer and the active layer are inclined.

2. The light emitting device of claim 1, wherein the ohmic contact layer is arranged between the active layer of one light emitting cell and the active layer of another light emitting cell.

3. The light emitting device of claim 1, further comprising a substrate on which the plurality of light emitting cell are disposed.

4. The light emitting device of claim 3, wherein the substrate is transparent.

5. The light emitting device of claim 1, further comprising a metal bump arranged on at least a partial portion of the ohmic contact layer.

6. The light emitting device of claim 5, wherein the metal bump is directly contacted to at least the partial portion of the ohmic contact layer.

7. The light emitting device of claim 3, wherein side surfaces of the P-type semiconductor layer, the active layer, and the N-type semiconductor layer are inclined 20-80 degrees, with respect to a plane of the substrate.

8. The light emitting device of claim 1, wherein the second insulation layer is formed by a CVD process.

\* \* \* \* \*